(12) United States Patent
Ishii et al.

(10) Patent No.: US 8,089,575 B2
(45) Date of Patent: Jan. 3, 2012

(54) DISPLAY DEVICE AND MANUFACTURING METHOD OF THE SAME

(75) Inventors: Miyo Ishii, Chiba (JP); Junichi Uehara, Mobara (JP); Kunihiko Watanabe, Mobara (JP)

(73) Assignees: Hitachi Displays, Ltd., Chiba-ken (JP); Panasonic Liquid Crystal Display Co., Ltd., Hyogo (JP)

( * ) Notice: Subject to any disclaimer, the term of this patent is extended or adjusted under 35 U.S.C. 154(b) by 0 days.

(21) Appl. No.: 12/881,560

(22) Filed: Sep. 14, 2010

(65) Prior Publication Data
US 2010/0327287 A1    Dec. 30, 2010

Related U.S. Application Data

(62) Division of application No. 12/017,384, filed on Jan. 22, 2008, now Pat. No. 7,829,395.

(30) Foreign Application Priority Data

Jan. 23, 2007  (JP) .................................. 2007-012114

(51) Int. Cl.
*H01L 27/14* (2006.01)
(52) U.S. Cl. ....... 349/43; 257/59; 257/72; 257/E29.122; 257/E29.117
(58) Field of Classification Search .................... 349/43; 257/59, 72, E29.117, E29.122
See application file for complete search history.

(56) References Cited

U.S. PATENT DOCUMENTS

| | | | |
|---|---|---|---|
| 6,707,107 B2 | 3/2004 | Kido | |
| 7,535,027 B2 * | 5/2009 | Moon et al. | .................... 257/84 |

FOREIGN PATENT DOCUMENTS

| | | |
|---|---|---|
| JP | 3-233431 | 10/1991 |
| JP | 2002-83765 | 3/2002 |

* cited by examiner

*Primary Examiner* — Minh-Loan T Tran
(74) *Attorney, Agent, or Firm* — Antonelli, Terry, Stout & Kraus, LLP.

(57) ABSTRACT

A display device includes a sequentially stacked body formed of a gate signal line, an insulation film, a semiconductor layer and a conductor layer on a substrate. The conductive layer forms a drain electrode and a source electrode of a thin film transistor which are arranged with a channel region of the semiconductor layer therebetween, and one of the drain and source electrode is formed in an approximately U shape having an open-ended one end side and a connecting portion on another end side so that the one electrode surrounds a distal end portion of another electrode as viewed in a plan view, and a projecting portion is formed on a side of the connecting portion opposite to the another electrode.

5 Claims, 7 Drawing Sheets

DISPLAY DEVICE AND MANUFACTURING METHOD OF THE SAME

CROSS REFERENCE TO RELATED APPLICATION

This application is a divisional application of U.S. application Ser. No. 12/017,384, filed Jan. 22, 2008, now U.S. Pat. No. 7,829,395, the contents of which are incorporated herein by reference.

The present application claims priority from Japanese application JP2007-12114 filed on Jan. 23, 2007, the content of which is hereby incorporated by reference into this application.

BACKGROUND OF THE INVENTION

1. Field of the Invention

The present invention relates to a display device and a manufacturing method of the display device, and more particularly to a display device which includes thin film transistors and a manufacturing method of the display device.

2. Description of the Related Art

This type of display device is configured such that a plurality of pixels is arranged on a display part in a matrix array, each pixel row formed of these pixels is sequentially selected by turning on the thin film transistors provided to the respective pixels in response to scanning signals supplied to the thin film transistors via the gate signal line, and video signals are supplied to the respective pixels of the pixel row via a drain signal line which is connected to corresponding pixels of another pixel row in common at timing of such selection.

Further, as the thin film transistor, there has been known a so-called bottom-gate-type transistor which arranges a gate electrode below a semiconductor layer. In manufacturing such a thin film transistor, a method which is referred to as a resist reflow method may be used.

That is, a drain electrode and a source electrode are formed by patterning a conductor layer formed on the semiconductor layer and, thereafter, a photoresist film formed on upper surfaces of these electrodes is made to remain, and the photoresist film is made to reflow to form a photoresist film (a modified photoresist film) which constitutes a mask for selectively etching the semiconductor layer.

By using such a method, in forming the mask for selectively etching the semiconductor layer, the number of use of photolithography technique can be omitted by one time and hence, the number of manufacturing steps can be decreased.

The detail of the method is disclosed in patent document 1 (JP-A-2002-83765), for example.

SUMMARY OF THE INVENTION

However, it is confirmed that the thin film transistor which is formed in this manner has following drawbacks. For example, in forming one electrode out of these electrodes into a U-shaped pattern, at a connecting portion of two respective rod-shaped conductor layers arranged in parallel to each other, a recessed portion is formed to the inside from the outside and, in a worst case, the recessed portion progresses thus separating the electrodes from each other at a portion of the connecting portion.

Upon seeking for causes of such a drawback, inventors of the present invention have found the property of the photoresist film that when the photoresist film formed on the upper surfaces of the electrodes is made to reflow, on an outer end portion (a distal end portion) of the connecting portion of the electrode, the photoresist film does not reflow to sufficiently cover the outer end portion sufficiently and hence, a mask is not formed on such a portion.

It is an object of the present invention to provide a manufacturing method of a display device which can reliably form electrodes in a thin film transistor.

It is another object of the present invention to provide a display device which can reliably form electrodes in a thin film transistor.

To briefly explain the summary of typical inventions among the inventions described in this application, they are as follows.

(1) method for manufacturing a display device according to the present invention includes, for example, the steps of: preparing a substrate having a sequentially stacked body formed of a gate signal line, an insulation film, a semiconductor layer and a conductor layer, for example; forming a drain electrode and a source electrode of a thin film transistor at least in a region where the thin film transistor is formed in a pattern in which one of the drain electrode and the source electrode is formed in an approximately U shape having an open-ended one end side and a connecting portion on another end side such that one electrode surrounds a distal end portion of another electrode as viewed in a plan view and a projecting portion is formed on a side of the connecting portion opposite to another electrode, wherein the respective electrodes are formed by selectively etching the conductor layer using a photoresist film as a mask; and etching the semiconductor layer using a deformed photoresist film which is formed by directly reflowing the photoresist film as a mask.

(2) A display device according to the present invention is configured, for example, such that a gate signal line, an insulation film, a semiconductor layer and a conductor layer are sequentially stacked on a substrate, for example, the conductor layer forms at least a drain electrode and a source electrode of a thin film transistor which are arranged with a channel region of the semiconductor layer sandwiched therebetween, the channel region overlaps the gate signal line, the drain electrode and the source electrode are formed in a pattern in which one of the drain electrode and the source electrode is formed in an approximately U shape having an open-ended one end side and a connecting portion on another end side such that one electrode surrounds a distal end portion of another electrode as viewed in a plan view and a projecting portion is formed on a side of the connecting portion opposite to another electrode, and the semiconductor layer is formed in a pattern in which the semiconductor layer forms a protruding portion which extends outwardly including a portion where at least the projecting portion is formed on the conductor layer as viewed in a plan view.

(3) The display device according to the present invention is also, for example, on a premise of the constitution (2), characterized in that the projecting portion has a distal end thereof formed in a semicircular shape.

(4) The display device according to the present invention is also, for example, on a premise of the constitution (2), characterized in that the projecting portion has a distal end thereof formed in a rectangular shape.

(5) The display device according to the present invention is also, for example, on a premise of the constitution (2), characterized in that one electrode is constituted of the drain electrode which is electrically connected to the drain signal line formed of the conductor layer via a connecting portion, and the projecting portion is formed to function also as the connecting portion.

(6) A method for manufacturing a display device according to the present invention includes, for example, the steps of:

preparing a substrate having a sequentially stacked body formed of a gate signal line, an insulation film, a semiconductor layer and a conductor layer, for example; forming a drain electrode and a source electrode of a thin film transistor at least in a region where the thin film transistor is formed in a pattern in which one of the drain electrode and the source electrode is formed in an approximately U shape having an open-ended one end side and a connecting portion on another end side such that one electrode surrounds a distal end portion of another electrode as viewed in a plan view and the connecting portion of one electrode has a width larger than widths of other portions of one electrode, wherein the respective electrodes are formed by selectively etching the conductor layer using a photoresist film as a mask; and etching the semiconductor layer using a deformed photoresist film which is formed by directly reflowing the photoresist film as a mask.

(7) A display device according to the present invention is configured such that a gate signal line, an insulation film, a semiconductor layer and a conductor layer are sequentially stacked on a substrate, for example, the conductor layer forms at least a drain electrode and a source electrode of a thin film transistor which are arranged with a channel region of the semiconductor layer sandwiched therebetween, the channel region overlaps the gate signal line, the drain electrode and the source electrode are formed in a pattern in which one of the drain electrode and the source electrode is formed in an approximately U shape having an open-ended one end side and a connecting portion on another end side such that one electrode surrounds a distal end portion of another electrode as viewed in a plan view and the connecting portion of one electrode has a large-width portion having a width larger than widths of other portions of one electrode, and the semiconductor layer is formed in a pattern in which the semiconductor layer forms a protruding portion which extends outwardly including a portion which includes at least the large-width portion on the conductor layer as viewed in a plan view.

(8) The display device according to the present invention is also, for example, on a premise of the constitution (7), characterized in that the connecting portion of one electrode has a side portion thereof on a side opposite to another electrode formed in a U shape and includes a large-width portion covering the center of the connecting portion.

(9) The display device according to the present invention is also, for example, on a premise of the constitution (7), characterized in that the connecting portion of one electrode has a side portion thereof on another-electrode side formed in a U shape and a side portion thereof on a side opposite to another electrode is formed in a U shape having a rectangular shape.

Here, the present invention is not limited to the above-mentioned constitutions and various modifications are conceivable without departing from the technical concept of the present invention.

The display device having such a constitution can reliably form electrodes on the thin film transistor.

DESCRIPTION OF THE PREFERRED EMBODIMENTS

Hereinafter, an embodiment of a display device according to the present invention is explained in conjunction with drawings.

Figure 2:
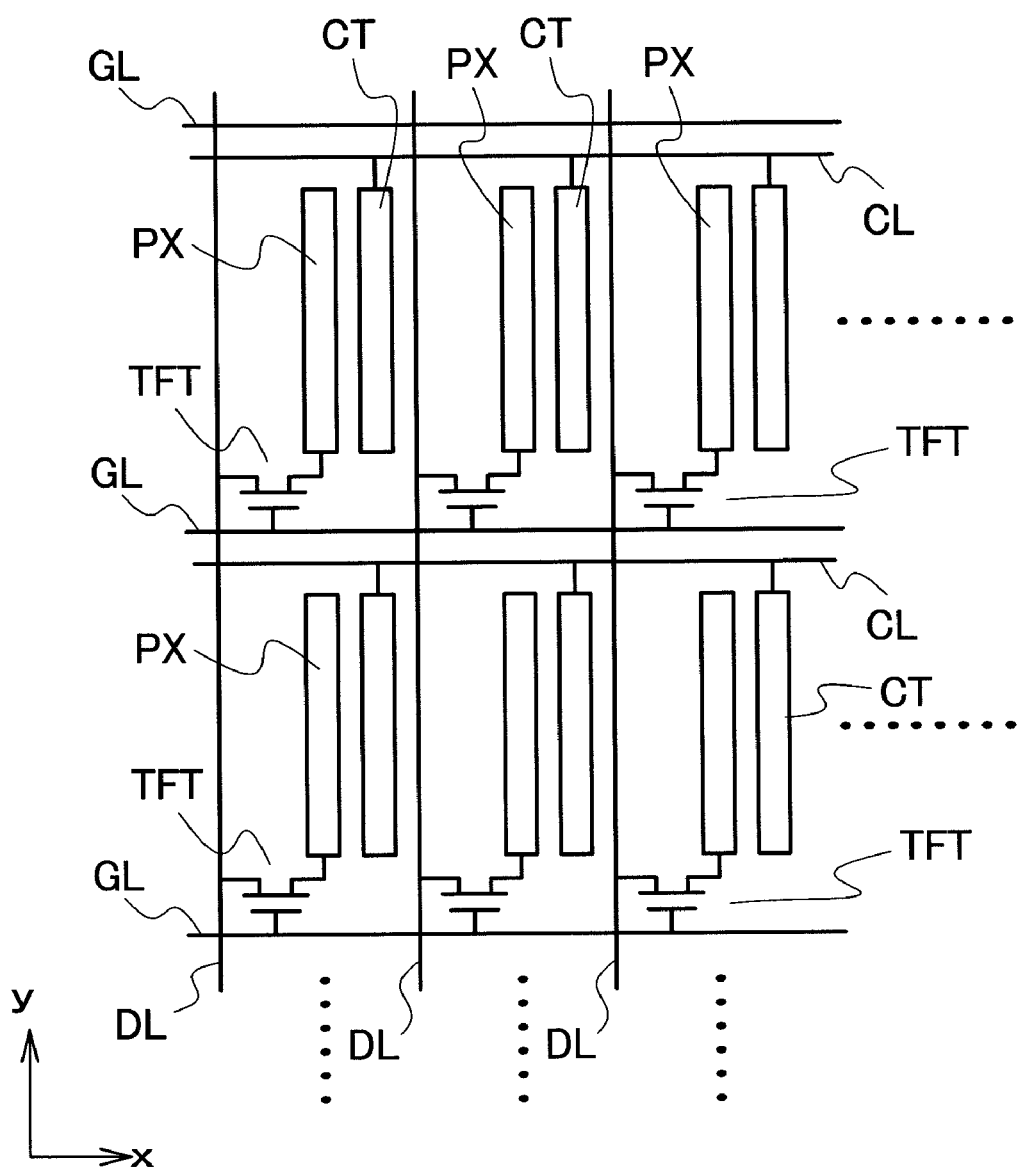
FIG. 2 is an equivalent circuit diagram showing pixels of the display device according to the embodiment of the present invention.

In FIG. 2, a liquid crystal display device is exemplified as a display device according to the present invention, for example. FIG. 2 shows one example of an equivalent circuit of a pixel in a liquid crystal display part of the to liquid crystal display device according to one embodiment. Further, FIG. 2 is a view showing a circuit which is formed on a liquid-crystal-side surface of one substrate SUB out of respective substrates which are arranged to face each other in an opposed manner with liquid crystal sandwiched therebetween. The circuit includes 6 pixels (=2×3 pixels), for example, which are arranged is close to each other.

In FIG. 2, each pixel has a region thereof defined from regions of other neighboring pixels by a pair of neighboring drain signal lines DL which extends in the y direction in the drawing and a pair of neighboring gate signal lines GL which extends in the x direction in the drawing.

Further, at one corner of the pixel, a thin film transistor TFT having the MIS structure is formed. The thin film transistor TFT has a gate electrode thereof connected to a gate signal line GL arranged close to the gate electrode and a drain electrode thereof connected to a drain signal line DL which is arranged close to the drain electrode.

Further, in the region of each pixel, a pair of electrodes consisting of a pixel electrode PX and a counter electrode CT is formed. The pixel electrode PX is connected to a source electrode of the thin film transistor TFT, and the counter electrode CT is connected to a common signal line CL which extends in the x direction in the drawing.

In such a circuit constitution, a reference voltage (a voltage which becomes the reference with respect to a video signal) is applied to the counter electrode CT of each pixel via the common signal line CL and a gate voltage is sequentially applied to the gate signal lines GL from an upper side of the drawing, for example, so as to select the pixel row. By supplying a video signal to the respective drain signal lines DL at timing of the selection of the pixel row, a voltage of the video signal is applied to the pixel electrodes PX of the respective pixels of the pixel row via the thin film transistors TFT which are turned on with the gate voltage. Further, a so-called lateral electric field having intensity corresponding to the voltage of the video signal is generated between the pixel electrode PX and the counter electrode CT, and liquid crystal molecules are driven in response to the intensity of the lateral electric field.

In such a circuit, the gate signal lines GL, the drain signal lines DL and the thin film transistors TFT exhibit the substantially same geometrical arrangements. However, for example, the counter electrode CT is formed in a planner shape in most of the region (80% or more, for example) of the pixel, and the pixel electrode PX is constituted of a plurality of strip-shaped electrodes which overlaps the counter electrode CT by way of an insulation film.

Accordingly, a capacitive element which uses the insulation film as a dielectric film is formed between the pixel electrode PX and the counter electrode CT together with the liquid crystal. When a video signal is applied to the pixel electrode PX, the applied video signal is stored in the capacitive element for a relatively long time.

Figure 3A:
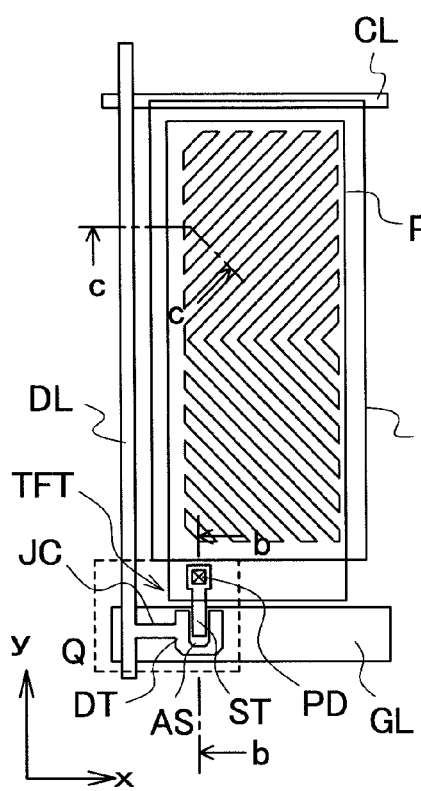
FIG. 3A to FIG. 3C are constitutional views of the pixel of the display device according to the embodiment of the present invention.
Figure 3B:
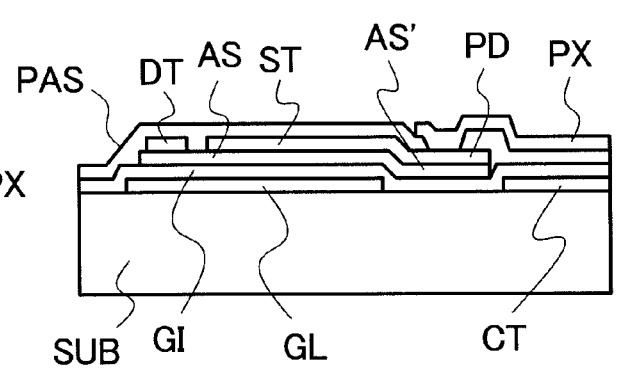
Figure 3C:
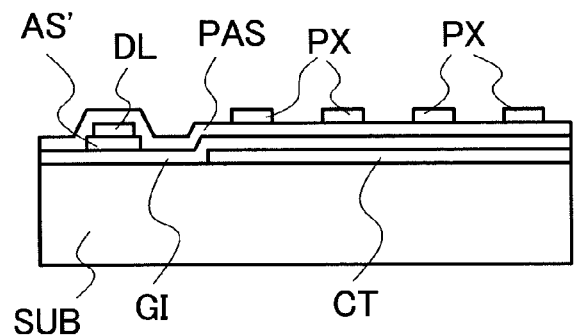

FIG. 3A to FIG. 3C are views showing the constitution of the pixel formed on a liquid-crystal-side surface of the substrate SUB formed of a transparent substrate, for example. The pixel shown in FIG. 3A to FIG. 3C indicates one pixel.

In FIGS. 3A to 3C, FIG. 3A is a plan view of the pixel, FIG. 3B is a cross-sectional view taken along a line b-b in FIG. 3A, and FIG. 3C is a cross-sectional view taken along a line c-c in FIG. 3A.

First of all, on the liquid-crystal-side surface (front surface) of the substrate SUB, the gate signal line GL and the common signal line CL are formed in parallel to each other with a relatively large distance therebetween.

In a region defined between the gate signal line GL and the common signal line CL, the counter electrode CT made of a transparent conductive material such as ITO (Indium-Tin-Oxide), for example, is formed. The counter electrode CT is formed to overlap the common signal line CL at a common-signal-line-CL-side peripheral portion thereof so that the counter electrode CT is electrically connected with the common signal line CL.

Further, the insulation film GI is formed on the surface of the substrate SUB in a state that the insulation film GI also covers the gate signal line GL, the common signal line CL and the counter electrode CT. The insulation film GI functions as a gate insulation film of the thin film transistor TFT in a region where the thin film transistor TFT described later is formed. A film thickness and the like of the insulation film GI are set in view of such a function.

A semiconductor layer AS made of amorphous silicon, for example, is formed on an upper surface of the insulation film GI at a position where the semiconductor layer AS overlaps a portion of the gate signal line GL. This semiconductor layer AS constitutes the semiconductor layer of the above-mentioned thin film transistor TFT.

Here, although it will become apparent by the explanation made later, the semiconductor layer AS is formed not only in the region where the thin film transistor TFT is formed but also below the drain signal line DL, below a connecting portion JC which electrically connects the drain signal line DL and the drain electrode DT of the thin film transistor TFT, and below a portion of the source electrode ST of the thin film transistor TFT which extends beyond a region where the thin film transistor TFT is formed respectively. Such a semiconductor layer AS is formed in the above-mentioned pattern by forming the thin film transistor TFT using a so-called registry flow method, for example. In this case, the formation of a stepped portion in the drain signal line DL, for example, can be decreased and hence, it is possible to acquire an advantageous effect that a so-called broken step defect can be obviated. In the explanation made hereinafter, out of the above-mentioned semiconductor layer AS, the semiconductor layer which is formed in the region other than the region where the thin film transistor TFT is formed may be also indicated by symbol AS'.

The drain signal line DL is formed in an extending manner in the y direction in the drawing, and includes an extending portion which extends toward the thin film transistor TFT side at a portion thereof. The extending portion (connecting portion JC) is connected to the drain electrode DT of the thin film transistor TFT formed on the semiconductor layer AS. Here, the connecting portion JC is formed on the gate signal line GL in an overlapping manner.

Further, the source electrode ST which is simultaneously formed with the formation of the drain signal line DL and the drain electrode DT faces the drain electrode DT on the semiconductor layer AS in an opposed manner and, at the same time, the source electrode ST has an extending portion which slightly extends toward the pixel region side from the semiconductor layer AS. This extending portion is configured such that the extending portion reaches a pad portion PD which is connected with the pixel electrode PX explained later.

In forming the semiconductor layer AS on the insulation film GI, the semiconductor layer AS is formed with a surface thereof doped with impurity of high concentration, for example. After forming the drain electrode DT and the source electrode ST by patterning, an impurity layer of high concentration which is formed in a region other than regions where the drain electrode DT and the source electrode ST are formed is etched using the drain electrode DT and the source electrode ST as masks. Due to such an operation, the impurity layer of high concentration remains between the semiconductor layer AS and the drain electrode DT as well as between the semiconductor layer AS and the source electrode ST, and the impurity layer forms an ohmic contact layer.

Due to such steps, as the thin film transistor TFT, the MIS-structure transistor having the so-called inverse staggered structure which uses the gate signal line GL as the gate electrode is formed.

The MIS-structure transistor is driven such that the drain electrode DT and the source electrode ST are changed over in response to applying of a bias. In the explanation made in this specification, for the sake of convenience, the electrode on a side connected to the drain signal line DL is referred to as the drain electrode DT, and the electrode on a side connected to the pixel electrode PX is referred to as the source electrode ST.

A protective film PAS is formed on a surface of the substrate SUB in a state that the protective film PAS also covers the thin film transistors TFT. The protective film PAS is provided for preventing the direct contact of the thin film transistor TFT with liquid crystal. Further, the protective film PAS is interposed as a layer between the counter electrode CT and the pixel electrode PX described later and also functions as a dielectric film of the capacitive element formed between the counter electrode CT and the pixel electrode PX along with the above-mentioned insulation film GI.

The pixel electrode PX is formed on an upper surface of the protective film PAS. The pixel electrode PX is made of a transparent conductive material such as ITO (Indium-Tin-Oxide), for example, and is formed on the counter electrode CT in an overlapping manner with a wide overlapping area.

Here, a large number of slits are formed in the pixel electrode PX in parallel in the direction intersecting the longitudinal direction of the pixel electrode PX thus being configured to have a group of electrodes consisting of a large number of strip-shaped electrodes which have both ends thereof connected to each other.

Further, on the surface of the substrate SUB, an orientation film (not shown in the drawing) is formed in a state that the orientation film also covers the pixel electrode PX. This orientation film is provided for setting the initial orientation direction of molecules of liquid crystal which is in direct contact with the orientation film.

With respect to the respective electrodes of the pixel electrode PX, as shown in FIG. 3A, the region of the pixel is divided in two vertically in the drawing, for example, wherein the respective electrodes in one region are formed to extend in the direction of +45° with respect to the running direction of the gate signal line GL, and the respective electrodes in another region are formed to extend in the direction of −45° with respect to the running direction of the gate signal line GL, for example. That is, the pixel electrode PX adopts a so-called multi-domain method. This method can eliminate a drawback that coloring occurs depending on the viewing direction when the direction of the slits formed in the pixel electrode PX (the direction of the group of electrodes forming the pixel electrode PX) in one pixel is the single direction. Accordingly, it is not always necessary for the pixel electrode PX to adopt such a constitution.

In the above-mentioned embodiment, the semiconductor layer of the thin film transistor TFT is made of amorphous silicon. However, the semiconductor layer of the thin film transistor TFT may be made of poly-silicon.

Figure 1:
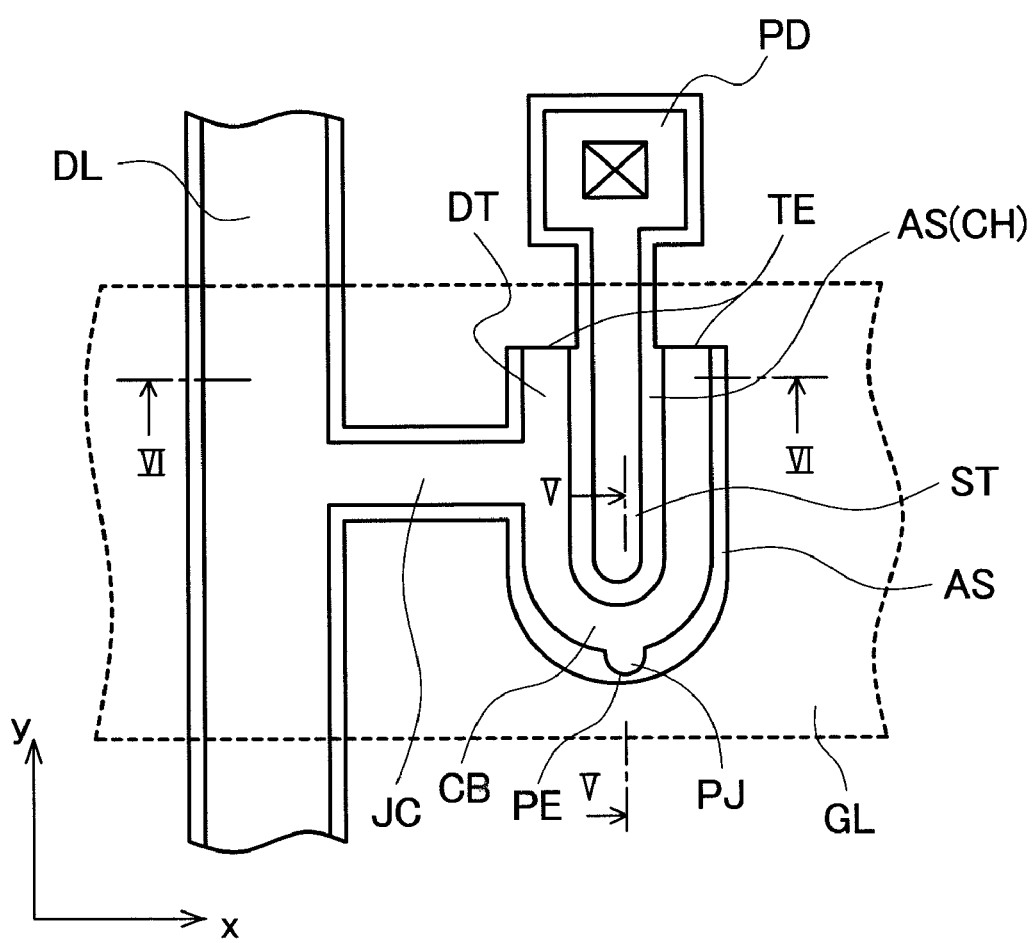
FIG. 1 is a constitutional view of a display device according to one embodiment of the present invention and also is a plan view showing a part of a thin film transistor.

FIG. 1 is a plan view of the thin film transistor TFT shown in FIG. 3A to FIG. 3C (a portion indicated by a dotted frame Q in the drawing) in an enlarged manner.

The semiconductor layer AS is formed on an upper surface of the insulation film GI (not shown in the drawing) formed to cover the gate signal line GL.

The semiconductor layer AS is formed by selective etching which uses a photo resist film (a deformed photo resist film) having the substantially same shape as the conductor layer formed on an upper surface of the semiconductor layer AS by patterning as a mask. The pattern schematically has the substantially same shape as the conductor layer. The pattern of the semiconductor layer AS is explained later in further detail.

The conductor layer is, first of all, constituted of the drain electrode DT and the source electrode ST of the thin film transistor TFT formed on the semiconductor layer AS which is arranged on the gate signal line GL in an overlapping manner.

The drain electrode DT has an approximately U-shape as viewed in a plan view. That is, the drain electrode DT is formed in a pattern in which two rod-shaped respective conductor layers are arranged in parallel with the longitudinal direction thereof aligned with the y direction in the drawing, and a connecting portion CB is formed by connecting the respective conductor layers to each other using a conductor layer in a lower portion of the drawing (one end of the drain electrode DT having an opening portion at an upper end portion thereof in the drawing).

The drain electrode DT is formed in a pattern in which the above-mentioned two rod-shaped respective conductor layers and the conductor layer which constitutes the connecting portion CB are formed such that the respective widths of these conductor layers are made substantially uniform and, at the same time, a projecting portion PJ having a semicircular shape is formed on an approximately center portion of the connecting portion CB on a side opposite to the channel region CH.

Due to such a constitution, a width of the approximately center portion of the connecting portion CB of the drain electrode DT is set larger than widths of portions of the drain electrode DT other than the center portion of the connecting portion CB.

The drain electrode DT formed in such a pattern is, as will become apparent later, configured to obviate an unfavorable phenomenon that, in forming the drain electrode DT, the connecting portion CB is formed in a pattern in which a side of the connecting portion CB opposite to the channel region CH is recessed excessively and, in a worst case, the connecting portion CB is separated or divided.

Here, the drain electrode DT is formed along with the formation of the drain signal line DL by performing selective etching of the conductor layer, and is configured to include the connecting portion JC for establishing the electrical connection with the drain signal line DL.

Further, the source electrode ST is formed simultaneously with the formation of the drain electrode DT, and the source electrode ST is formed in a linear pattern in which the source electrode ST is inserted into the U-shaped drain electrode DT from the opening portion and extends toward the connecting-portion-CB side, and is arranged in the extending manner in the y direction in the drawing.

Due to such a constitution, the drain electrode DT is formed in a pattern in which the drain electrode DT surrounds a distal end portion of the source electrode ST as viewed in a plan view, and a U-shaped channel region CH in which the drain electrode DT and the source electrode ST face each other is formed on a surface of a semiconductor layer AS. Due to such a constitution, it is possible to increase a channel width in the channel region CH.

Here, the source electrode ST extends toward the pixel region side in an upper portion of the drawing relative to the gate signal line GL while getting over the gate signal line GL, and is connected to the pad portion PD for establishing the connection of the source electrode ST with the pixel electrode PX not shown in the drawing. The pad portion PD is also formed by selective etching of the conductor layer and is formed together with the source electrode ST.

Further, the semiconductor layer AS is configured to have a protruding portion. This protruding portion slightly extends outwardly not only from a lower region of the conductor layer which constitutes the drain signal line DL, the connecting portion JC, the drain electrode DT, the source electrode ST and the pad portion PD respectively (a region which overlaps the conductor layer), and the channel region CH defined between the drain electrode DT and the source electrode ST respectively but also from a profile which is defined by these regions along the substantially whole circumference of the profile.

Here, the expression that the protruding portion of the semiconductor layer AS extends outwardly along the "substantially" whole circumference of the profile implies that at portions of the whole circumference of the profile, for example, at electrode ends TE of the drain electrode DT on the opening portion of the drain electrode DT (a portion on a side opposite to the connecting portion CB), the semiconductor layer AS does not protrude to the outside of the profile in some cases. When such protruding portions such as the electrode ends TE are present on the conductor layer, in reflowing the photoresist film, there may be a case in which the photoresist film does not extend and flow to the outside of the electrode ends TE to cover the electrode ends TE.

However, also in this case, since the projecting portion PJ is formed in the connecting portion CB of the drain electrode DT, it is possible to ensure the projecting portion PJ and the protrusion of the semiconductor layer AS to the outside of the connecting portion CB.

By forming the projecting portion PJ on the drain electrode DT, the photoresist film before reflowing is increased by an amount corresponding to a portion thereof formed above the projecting portion PJ. Accordingly, in reflowing the photoresist film, the photoresist film easily flows while extending toward the outside of the distal end of the projecting portion PJ so that the projecting portion PJ is sufficiently covered with the deformed photoresist film.

FIG. 4A to FIG. 4F are step views of a manufacturing method of the display device according to one embodiment of the present invention showing a portion of the thin film transistor TFT. The respective step views shown in FIG. 4A to FIG. 4F indicate a cross section taken along a line VI-VI in FIG. 1. Hereinafter, the manufacturing method is explained in order of steps in conjunction with FIG. 4A to FIG. 4F.

Figure 4A:
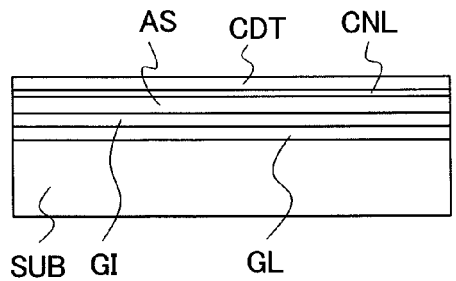
FIG. 4A to FIG. 4F are views showing steps of a method for manufacturing the display device according to the embodiment of the present invention.

Firstly, as shown in FIG. 4A, the substrate SUB which forms the gate signal lines GL and the insulation film GI on a main surface (liquid-crystal-side surface) thereon is prepared. Here, the insulation film GI also covers the gate signal lines GL.

On a whole area of an upper surface of the insulation film GI formed on the substrate SUB, the semiconductor layer AS and the conductor layer CDT are sequentially stacked using a CVD method, for example.

Here, the semiconductor layer AS is made of amorphous Si, for example, and a surface of the semiconductor layer AS is doped with n-type impurity of high concentration thus forming a high concentration impurity layer CNL. This high-concentration impurity layer CNL functions as an ohmic contact layer of the thin film transistor TFT.

Figure 4D:
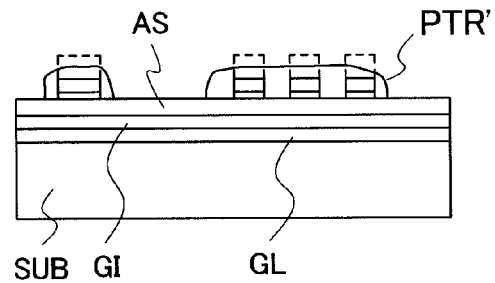
Figure 4B:
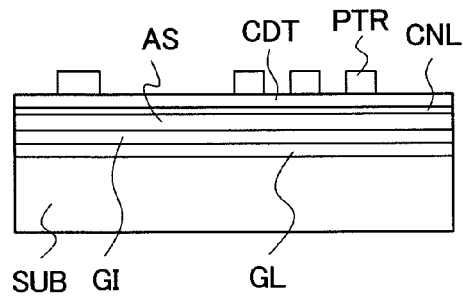

Next, as shown in FIG. 4B, a photoresist film is applied to a whole area of a surface of the conductor layer CDT, and the photoresist film is formed by patterning by selectively removing the photoresist film using a well-known photolithography technique.

Here, a pattern of the remaining photoresist film PTR is substantially equal to a pattern of the conductor layer CDT which is expected to remain by selective etching.

Figure 4E:
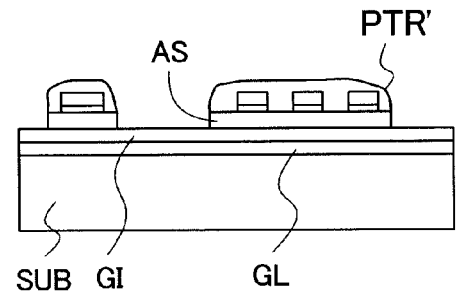
Figure 4C:
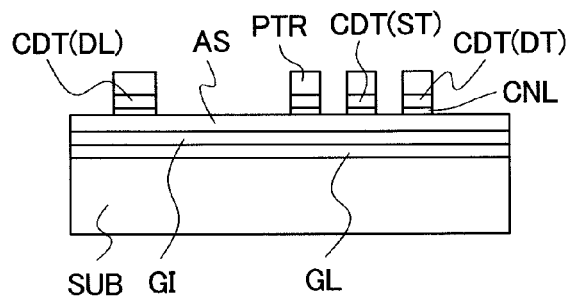

Next, as shown in FIG. 4C, the conductor layer CDT and the high-concentration impurity layer CNL are sequentially selectively etched using the remaining photoresist film PTR as a mask. Here, for example, the conductor layer CDT is etched by so-called wet etching and the high-concentration impurity layer CNL is etched by dry etching.

The remaining conductor layer CDT acquired by selective etching forms the drain electrode DT and the source electrode ST of the thin film transistor TFT, the drain signal line DL connected to the drain electrode DT (including the connecting portion JC with the drain electrode DT), and the pad portion PD of the source electrode ST which is connected with the pixel electrode.

Here, even at a stage in which selective etching of the conductor layer CDT and the high-concentration impurity layer CNL is finished, the processing advances to the next step without removing the photoresist film PTR.

Next, as shown in FIG. 4D, a deformed photoresist film PTR' is formed by reflowing the photoresist film PTR. The deformed photoresist film PTR' formed by reflowing is formed such that, for example, the photoresist film PTR is exposed to vapor of an organic solvent solution for 1 to 3 minutes thus gradually impregnating the organic solvent solution into the photoresist film PTR whereby the photoresist film PTR is dissolved by the organic solvent solution.

Due to this reflowing, the photoresist film PTR formed above the patterned conductor layer CDT flows and extends, as viewed in a plan view, to the outside of the conductor layer CDT. In other words, the photoresist film PTR flows and protrudes from a profile of the conductor layer CDT.

In this case, when another conductor layer CDT is arranged close to the conductor layer CDT, the photoresist film PTR which flows from the conductor layer CDT and the photoresist film PTR which flows from another conductor layer CDT are merged with each other and hence, a narrow region defined between the conductor layer CDT and another conductor layer CDT is filled with the photoresist film PTR (PTR'). That is, a portion corresponding to the channel region CH defined between the drain electrode DT and the source electrode ST is filled with the deformed photoresist film PTR'.

Further, in reflowing the photoresist film PTR, there may be a case that the photoresist film does not sufficiently cover the electrode ends TE of an opening portion (a portion on a side opposite to the connecting-portion-CB side of the drain electrode DT out of the conductor layer CDT. This is because that, as mentioned previously, in reflowing the photoresist film PTR, the photoresist film PTR has a property which makes the flowing of the photoresist film PTR to the outside of the electrode end TE difficult.

Figure 5:
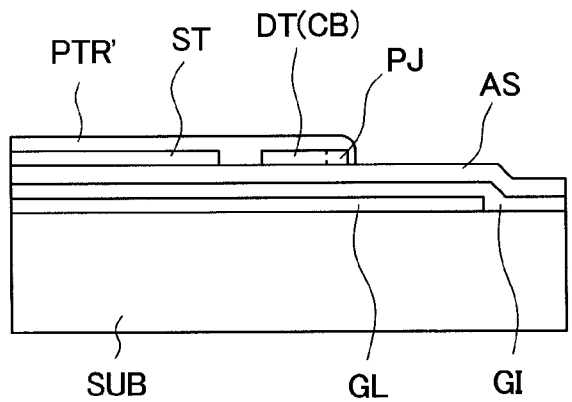
FIG. 5 is a cross-sectional view of the display device in one step of the method for manufacturing the display device according to the present invention.

Then, at a distal end PE of the projecting portion PJ formed on the connecting portion CB of the drain electrode DT, as mentioned previously, the photoresist film PTR which is formed above the projecting portion PJ reflows such that the photoresist film PTR covers the projecting portion PJ. FIG. 5 which is a cross-sectional view taken along a line V-V in FIG. 1 is a view showing a state in which the deformed photoresist film PTR' formed by reflowing sufficiently covers the connecting portion CB of the drain electrode DT together with the projecting portion PJ.

In this case, even when the conductor layer CDT is made of, for example, aluminum (Al), titanium (Ti) or molybdenum (Mo) and the semiconductor layer AS is selectively etched by dry etching, the conductor layer CDT is sufficiently covered with the deformed photoresist film PTR' and hence, this embodiment can also acquire an advantageous effect that the occurrence of hillock from the conductor layer CDT can be obviated.

Next, as shown in FIG. 4E, using the deformed photoresist film PTR' formed by reflowing as a mask, a portion of the semiconductor layer AS exposed from the mask is selectively etched by dry etching, for example. Due to such selective etching, the semiconductor layer AS is formed by patterning shown in FIG. 1.

Figure 4F:
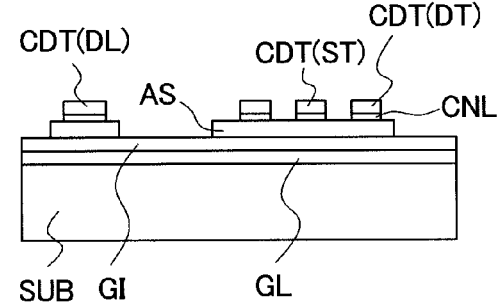

Then, as shown in FIG. 4F, by removing the deformed photoresist film PTR', the formation of the thin film transistor TFT is finished. After the formation of the thin film transistor TFT, the protective film PAS is formed on the surface of the substrate SUB in a state that the protective film PAS covers the thin film transistor TFT, and the pixel electrode PX is formed on an upper surface of the protective film PAS.

Figure 10:
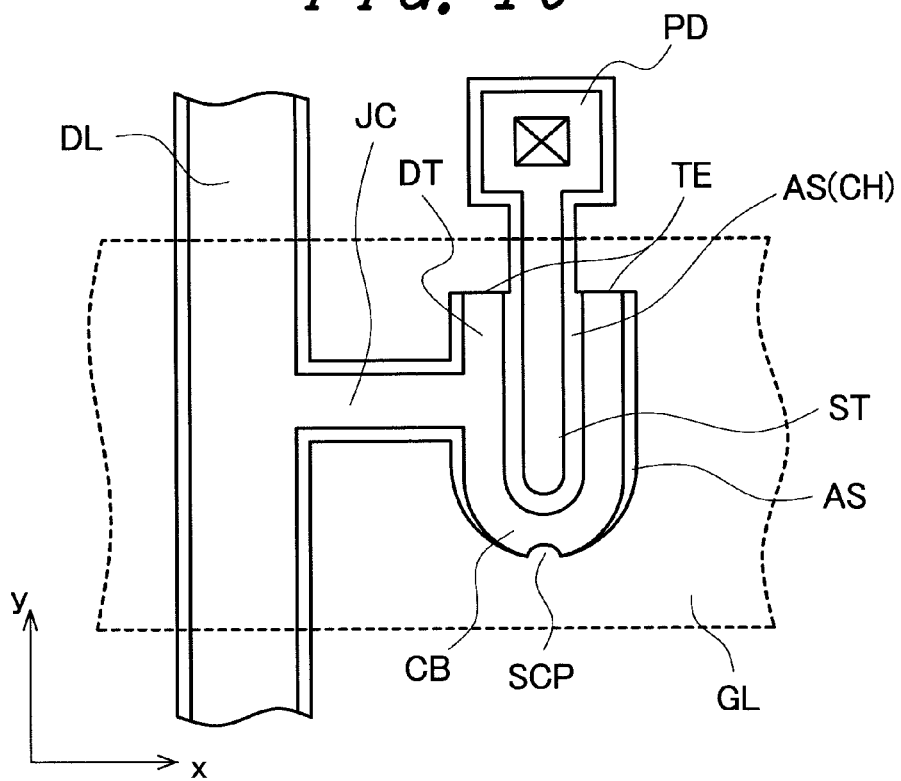
FIG. 10 is an explanatory view of a drawback which arises when the present invention is not applied to a display device.

Here, in manufacturing the display device through these steps, when the drain electrode DT of the thin film transistor TFT is formed in a pattern with no projecting portion PJ, as shown in FIG. 10 which corresponds to FIG. 1, there may be a case that a recessed portion SCP may be formed in a portion of an outer side of the connecting portion CB of the drain electrode DT together with the semiconductor layer AS formed below the drain electrode DT. This is because that etching is performed in a state that the deformed photoresist film PTR' does not cover the drain electrode DT sufficiently at such a portion.

Figure 6:
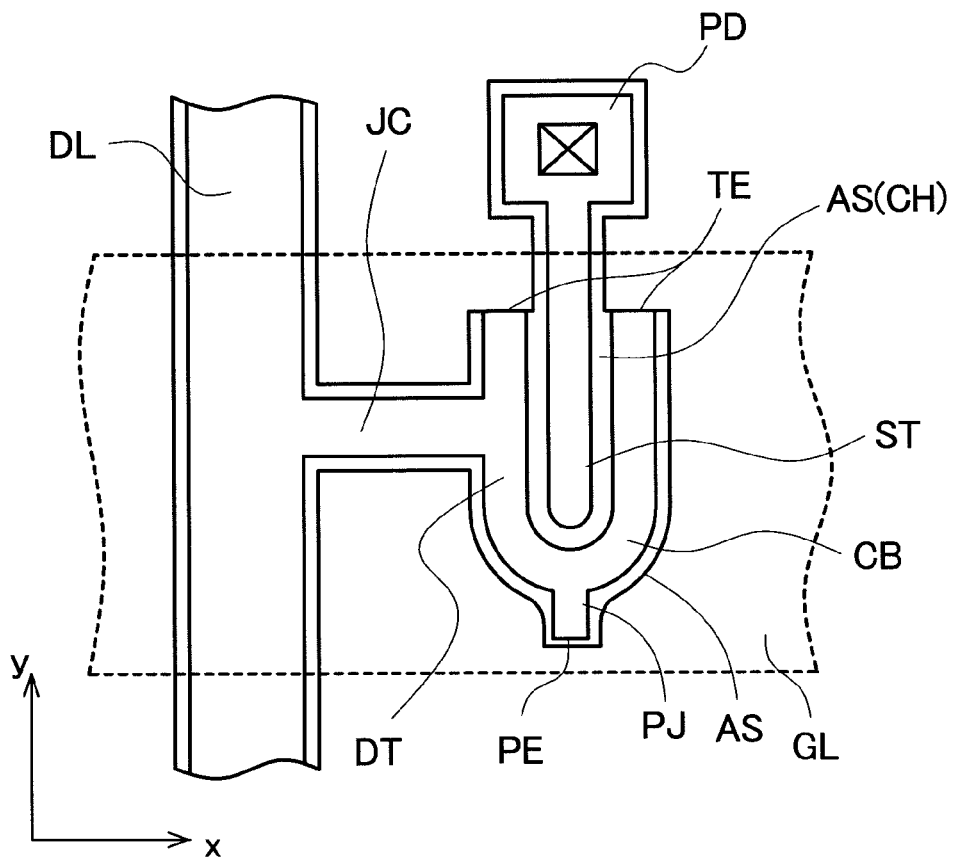
FIG. 6 is a constitutional view of a display device according to another embodiment of the present invention.

In the above-mentioned embodiment, although the projecting portion PJ formed on the drain electrode DT of the thin film transistor TFT is formed in a semicircular shape, the shape of the projecting portion PJ is not limited to such a shape. For example, as shown in FIG. 6 which is depicted corresponding to FIG. 1, the projecting portion PJ formed on the drain electrode DT may have a rectangular shape. That is, it is sufficient that by forming the projecting portion PJ, a width of the approximately center portion of the connecting portion CB of the drain electrode DT is set larger than widths of portions of the drain electrode DT other than the connecting portion CB.

Figure 7:
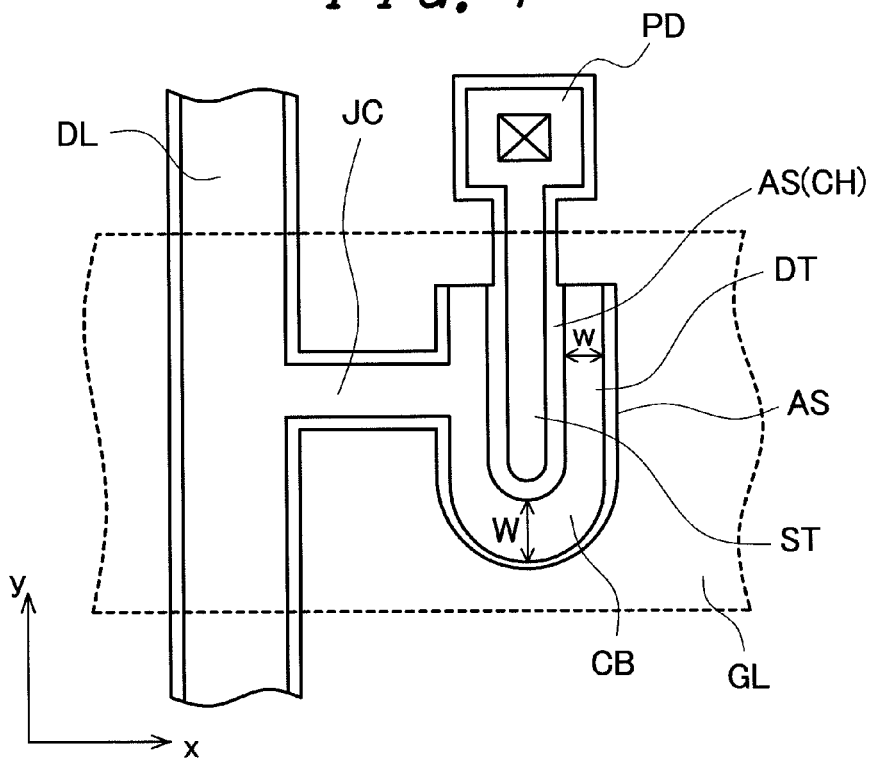
FIG. 7 is a constitutional view of a display device according to another embodiment of the present invention.

Based on such a definition of the projecting portion PJ, as shown in FIG. 7, the drain electrode DT may be formed in a pattern in which the drain electrode DT has a width w at an opening-portion side and the width of the drain electrode DT is gradually increased toward the center portion of the connecting portion CB and the width assumes a maximum width W (>w) at the center portion of the connecting portion CB.

Figure 8:
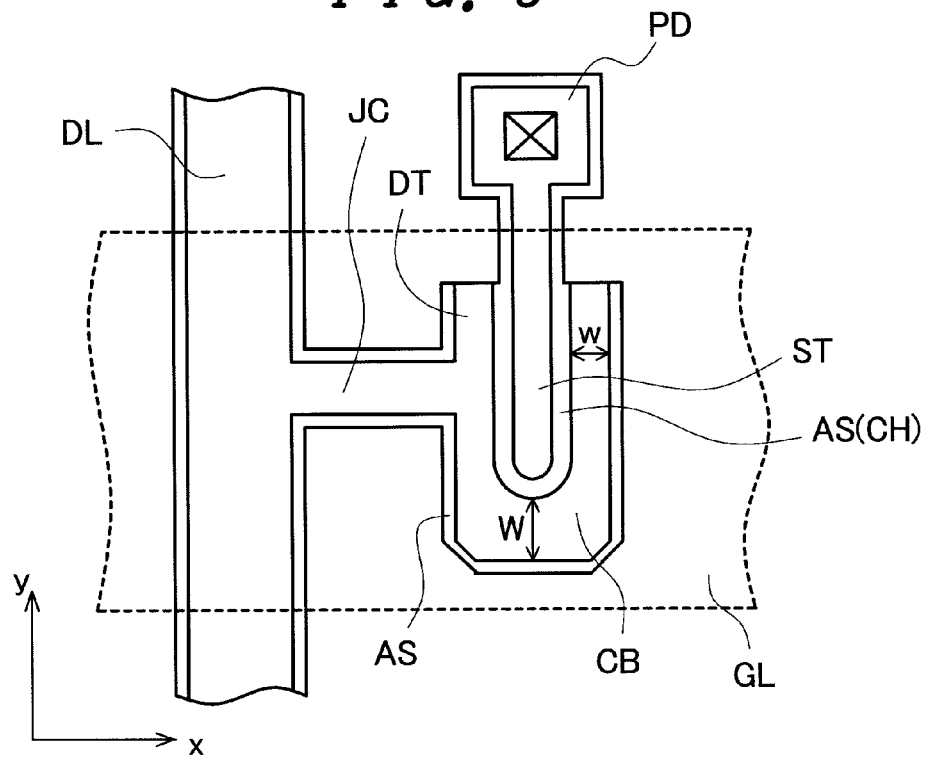
FIG. 8 is a constitutional view of a display device according to another embodiment of the present invention.

Further, as shown in FIG. 8, the drain electrode DT may be formed in a U shape having an arcuate portion at the connecting portion CB on a source-electrode-ST side and an approximately U-shape having a rectangular portion at the connecting portion CB on a side opposite to the source-electrode-ST side thus forming a pattern in which the width of the drain electrode DT assumes a width w on the opening-portion side and a width W (>w) at the center portion of the connecting portion CB.

Figure 9:
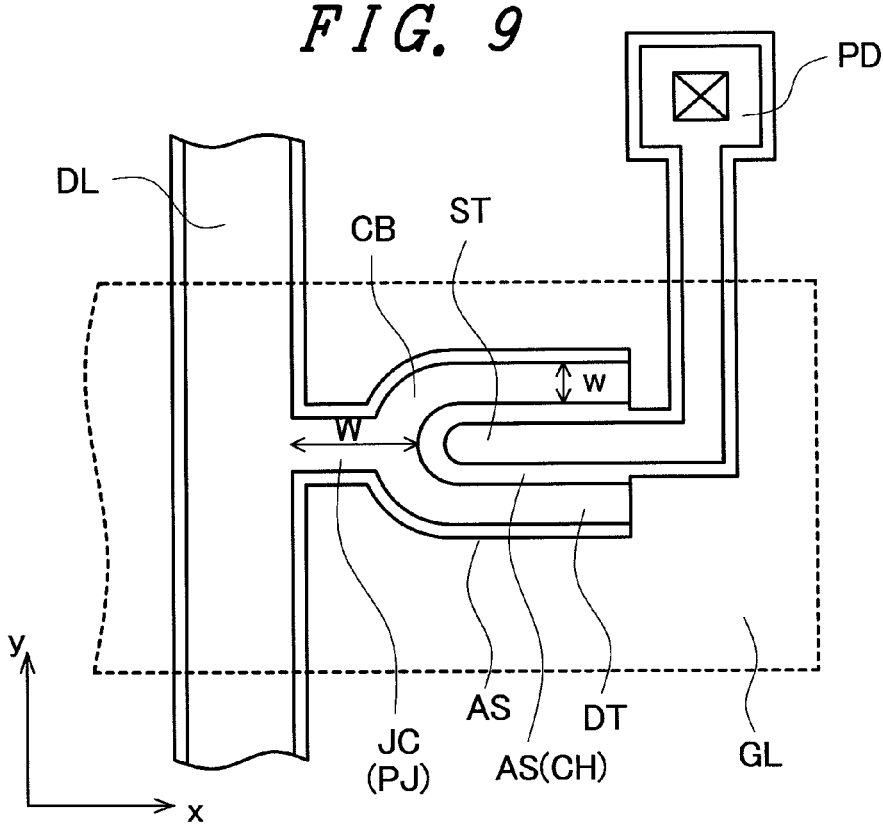
FIG. 9 is a constitutional view of a display device according to another embodiment of the present invention.

Further, FIG. 9 shows a case in which in forming the projecting portion PJ on the connecting portion CB of the drain electrode DT of the thin film transistor TFT, the projecting portion PJ is also configured to function as the connecting portion JC which connects the drain electrode DT to the drain signal line DL.

To provide such a constitution, in FIG. 9, the U-shaped drain electrode DT is, for example, configured such that two respective rod-shaped conductor layers on an opening portion side of the drain electrode DT are arranged in parallel to each other with the longitudinal direction thereof aligned with the x direction in the drawing, and the connecting portion CB is positioned on the drain-signal-line-DL side.

Further, to provide such a constitution, the source electrode ST which is arranged in the extending manner in the x direction in the drawing is bent on a side at which the source electrode ST is connected to the pixel electrode PX (not shown in the drawing), and is connected to the pad portion PD on the pixel region at an upper portion of the drawing with respect to the gate signal line GL.

The thin film transistor TFT having such a constitution can acquire advantageous effects similar to the advantageous effects acquired by the projecting portion PJ shown in FIG. 1, for example, by the provision of the connecting portion JC which establishes the electrical connection between the drain electrode DT and the drain signal line DL. Further, the drain electrode DL is formed in a pattern in which the drain electrode DL has a width w at the opening-portion side thereof and a width W (>w) at the center portion of the connecting portion CB.

In the respective embodiments explained heretofore, it is needless to say that the source electrode ST is formed in a U-shape in place of forming the drain electrode DT in a U-shape.

In the liquid crystal display device of the above-mentioned embodiment, the liquid crystal (liquid crystal molecules) is configured to be driven by an electric field referred to as a so-called lateral electric field with respect to the substrate (SUB). However, the present invention is not limited to the liquid crystal display device which adopts the lateral electric field for driving the liquid crystal but also is applicable to a liquid crystal display device which adopts an electric field referred to as a so-called vertical electric field, for example, for driving the liquid crystal.

In the above-mentioned embodiments, the display device of the present invention has been explained by taking the liquid crystal display device as an example. However, the present invention is also applicable to other display device such as an organic EL display device, for example. This is because the organic EL display device is also configured by providing a thin film transistor for every pixel, for example, and has tasks to be solved which are substantially equal to the above-mentioned tasks to be solved.

The above-mentioned respective embodiments may be used in a single form or in combination. This is because these embodiments can acquire the advantageous effects of the respective embodiments individually or synergistically.

What is claimed is:

1. A display device being configured such that a gate signal line, an insulation film, a semiconductor layer and a conductor layer are sequentially stacked on a substrate, the conductor layer forms at least a drain electrode and a source electrode of a thin film transistor and a drain signal line which are arranged with a channel region of the semiconductor layer sandwiched therebetween, the channel region overlaps the gate signal line, the drain electrode and the source electrode are formed in a pattern in which the drain electrode is formed in an approximately U shape having an open-ended one end side of the U shape and a connecting portion on another end side of the U shape such that the drain electrode surrounds a distal end portion of the source electrode as viewed in plan view and a projecting portion is formed on a side of the connecting portion opposite to the source electrode, and the semiconductor layer and the conductor layer overlap, and the semiconductor layer forms a protruding portion which extends outwardly beyond the conductor layer including at the projecting portion as viewed in plan view.

2. A display device according to claim 1, wherein the projecting portion has a distal end thereof formed in a semicircular shape.

3. A display device according to claim 1, wherein the projecting portion has a distal end thereof formed in a rectangular shape.

4. A display device according to claim 1, wherein the drain electrode is electrically connected to the drain signal line via the connecting portion, and the projecting portion is formed to function also as the connecting portion.

5. A display device according to claim 1, wherein the protruding portion of the semiconductor layer extends outwardly beyond the conductor layer at the projecting portion, at the drain electrode including the connecting portion, at the source electrode, and at the drain signal line, as viewed in plan view.

* * * * *